(12) United States Patent
Noe

(10) Patent No.: US 6,486,676 B2
(45) Date of Patent: Nov. 26, 2002

(54) REFLECTION MEASUREMENT METHOD AND APPARATUS FOR DEVICES THAT ARE ACCESSED THROUGH DISPERSIVE ELEMENTS

(75) Inventor: Terrence R. Noe, Sebastopol, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/812,038

(22) Filed: Mar. 19, 2001

(65) Prior Publication Data

US 2002/0130667 A1 Sep. 19, 2002

(51) Int. Cl.$^7$ .......................... G01R 31/11; G01R 31/08
(52) U.S. Cl. ........................................ 324/534; 324/535
(58) Field of Search ............................... 324/531–535; 378/87, 86, 85, 70; 73/602

(56) References Cited

U.S. PATENT DOCUMENTS 5,305,239 A * 4/1994 Kinra .......................... 73/602
5,371,505 A * 12/1994 Michaels .................... 342/360
6,134,003 A * 10/2000 Tearney et al. ............. 356/345
6,343,510 B1 * 2/2002 Neeson et al. ............... 73/602

* cited by examiner

Primary Examiner—N. Le
Assistant Examiner—Amy He
(74) Attorney, Agent, or Firm—John L. Imperato

(57) ABSTRACT

A reflection measurement method and apparatus measures reflection characteristics of a device under test (DUT) when access to the DUT is through a dispersive element. The method and apparatus measure a composite reflection response of a network that includes the DUT and the dispersive element coupled to the DUT via a transmission line. A reflection response of the dispersive element is isolated from a remainder of the composite reflection response of the network. A set of transmission parameters for the dispersive element is generated from the isolated reflection response of the dispersive element and is then applied to the remainder of the composite reflection response of the network to extract the reflection characteristic of the DUT.

24 Claims, 3 Drawing Sheets

REFLECTION MEASUREMENT METHOD AND APPARATUS FOR DEVICES THAT ARE ACCESSED THROUGH DISPERSIVE ELEMENTS

BACKGROUND AND SUMMARY OF THE INVENTION

Time domain reflectometry and frequency domain network analysis are traditional techniques used to measure reflection characteristics of a device under test (DUT). There is a need to adapt these techniques to measure reflection characteristics of a DUT when access to the DUT is through a dispersive element. This need is met by a reflection measurement method and apparatus constructed according to the embodiments of the present invention.

DETAILED DESCRIPTION OF THE EMBODIMENTS

Figure 1:
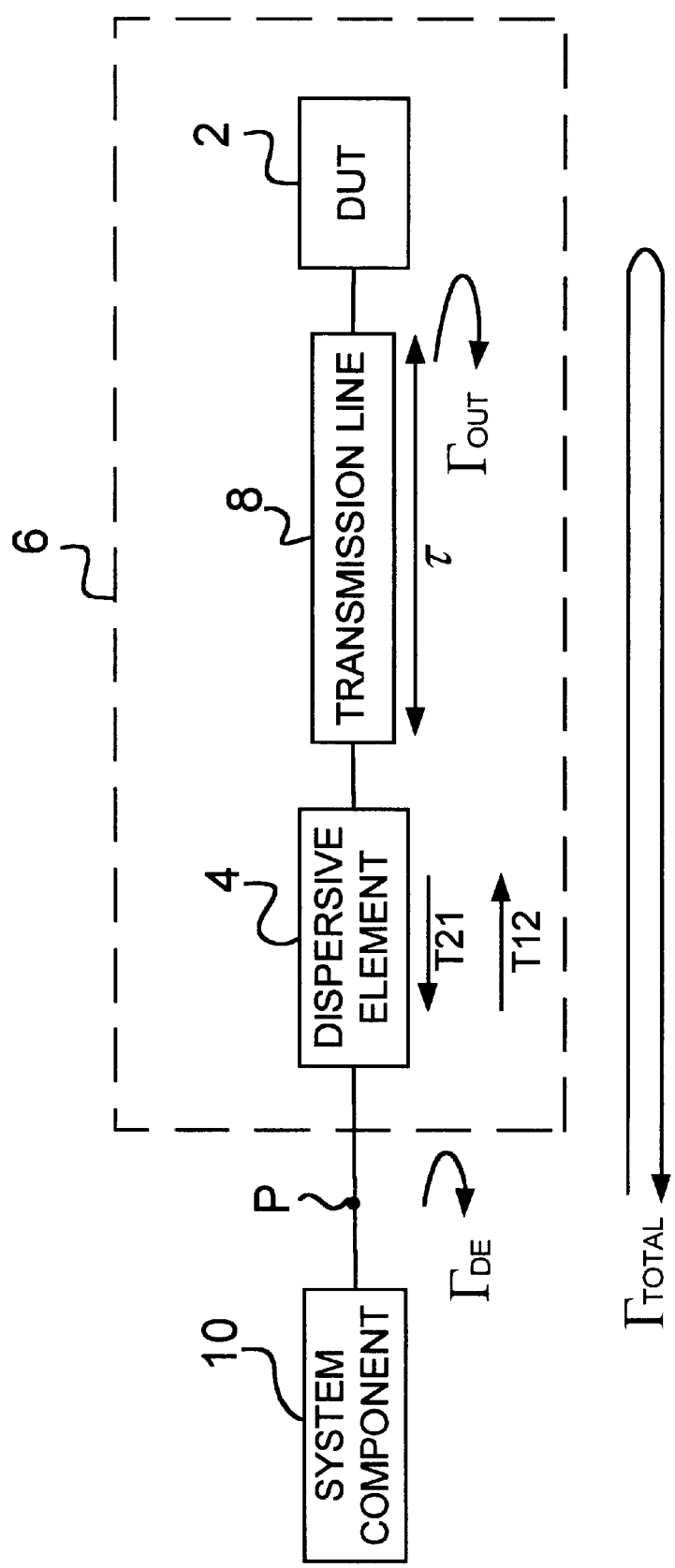
FIG. 1 shows a network having a dispersive element coupled between a device under test (DUT) and an access point of the network.

FIGS. 1–4 show aspects of the method 20 and apparatus 30 constructed according to the embodiments of the present invention. The method 20 constructed according to a first embodiment of the present invention measures a reflection characteristic $\Gamma_{DUT}$ of a device under test (DUT) 2 when access to the DUT 2 is through a dispersive element 4. The method 20 includes measuring a composite reflection response $\Gamma_{TOTAL}$ of a network 6 that includes the DUT 2 and the dispersive element 4 coupled to the DUT 2 via a transmission line 8. A reflection response $\Gamma_{DE}$ of the dispersive element 4 is isolated from a remainder $\Gamma_R$ of the composite reflection response $\Gamma_{TOTAL}$ of the network 6. A set of transmission parameters $T_{21}$, $T_{12}$ for the dispersive element 4 is generated from the isolated reflection response $\Gamma_{DE}$ of the dispersive element 4. Then, the generated set of transmission parameters $T_{21}$, $T_{12}$ are applied to the remainder $\Gamma_R$ of the composite reflection response $\Gamma_{TOTAL}$ of the network 6 to extract the reflection characteristic $\Gamma_{DUT}$ of the DUT 2.

The apparatus 30 constructed according to a second embodiment of the present invention also measures the reflection characteristic $\Gamma_{DUT}$ of a DUT 2 when access to the DUT 2 is through a dispersive element 4. The apparatus 30 includes a source 32 that provides a stimulus signal 31 to the network 6 and a receiver 34 that measures the composite reflection response $\Gamma_{TOTAL}$ of the network 6 to the stimulus signal 31. The receiver 34 interfaces with a processor 36 that isolates the reflection response $\Gamma_{DE}$ of the dispersive element 4 from the remainder $\Gamma_R$ of the composite reflection response $\Gamma_{TOTAL}$ of the network 6, generates the set of transmission parameters $T_{21}$, $T_{12}$ for the dispersive element 4 from the isolated reflection response $\Gamma_{DE}$ of the dispersive element 4, and applies the generated set of transmission parameters $T_{21}$, $T_{12}$ to the remainder $\Gamma_R$ of the composite reflection response $\Gamma_{TOTAL}$ of the network 6 to extract the reflection characteristic $\Gamma_{DUT}$ of the DUT 2.

FIG. 1 shows the network 6 that includes the DUT 2 and the dispersive element 4 coupled to the DUT 2 via the transmission line 8. The transmission line 8 has an associated propagation delay $\tau$. Access to the DUT 2 is through the dispersive element 4, with the dispersive element 4 and transmission line 8 being interposed between an access point P and the DUT 2. In one example, the network 6 is part of a cellular communication system and is coupled to a system component 10, such as a cellular base station. Within such a network 6, the DUT 2 is a single antenna, or alternatively, multiple antennae in an array, the dispersive element 4 is a lightning arrester, and the transmission line 8 is a coaxial cable. However, many types of networks 6 are well-suited for use with the reflection measurement method 20 and apparatus 30 constructed according to the embodiments of the present invention. The dispersive element 4 within the networks 6 are low loss elements or components having nonlinear phase characteristics versus frequency or having a frequency-dependent amplitude characteristic. The transmission line 8 is a coaxial cable, micro-strip line, strip line, or other type of transmission structure having sufficient propagation delay $\tau$ to distinguish a first discontinuity 1 from a second discontinuity 3 in a time domain reflection response $\Gamma_{TOTAL}(t)$ of the network 6 (shown in FIG. 4).

The composite reflection response $\Gamma_{TOTAL}$ of the network 6 is present at the access point P to the network 6. The dispersive element 4 has an associated forward transmission parameter $T_{21}$ and reverse transmission parameter $T_{12}$. The DUT 2 has the reflection characteristic $\Gamma_{DUT}$ that is measured by the method 20 and apparatus 30 constructed according to the embodiments of the present invention. The accuracy with which the method 20 and apparatus 30 measure the reflection characteristics of the DUT 2 generally increases as the loss, or dissipation, of the dispersive element 4 decreases.

Figure 2:
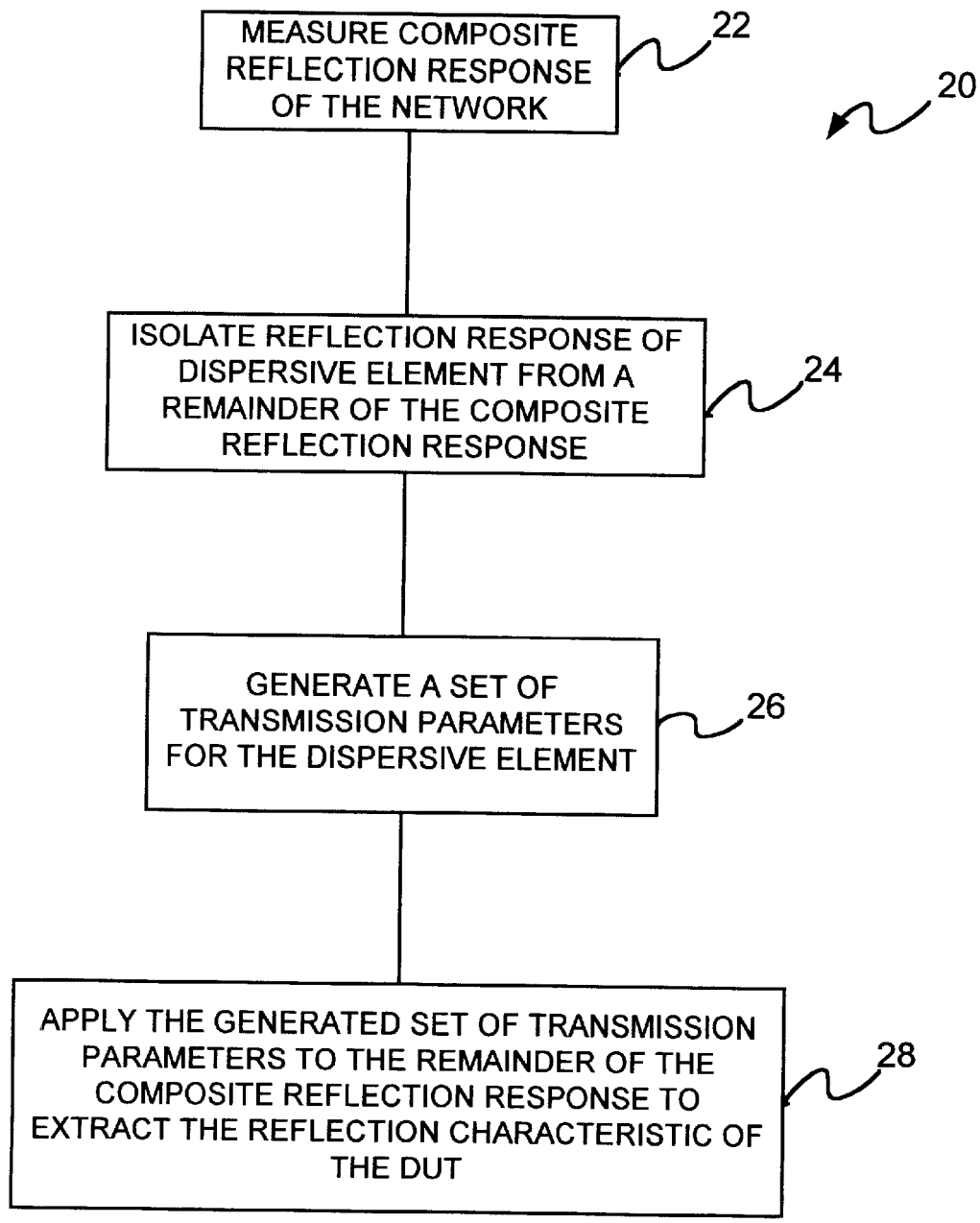
FIG. 2 is a flow chart of a reflection measurement method constructed according to a first embodiment of the present invention.

FIG. 2 is a flow chart of the reflection measurement method 20 constructed according to the first embodiment of the present invention. In step 22 of the method 20, the composite reflection response $\Gamma_{TOTAL}$ of the network 6 is measured. The composite reflection response $\Gamma_{TOTAL}$ of the network 6 is measured in the frequency domain, resulting in a frequency domain reflection response $\Gamma_{TOTAL}(f)$. Alternatively, the composite reflection response $\Gamma_{TOTAL}$ is measured in the time domain, resulting in a time domain reflection response $\Gamma_{TOTAL}(t)$. When the composite reflection response $\Gamma_{TOTAL}$ of the network 6 is measured in the frequency domain, the measurement includes applying a stimulus signal, having a predefined frequency span, to the network 6 and detecting the frequency domain reflection response $\Gamma_{TOTAL}(f)$ of the network 6 to the stimulus signal. Typically, the stimulus signal is a signal that is swept or stepped through the predefined frequency span, where the predefined frequency span has sufficient width to enable the frequency domain reflection response $\Gamma_{TOTAL}(f)$ to resolve faults, impedance mismatches and other discontinuities in the network 6. The frequency domain reflection response $\Gamma_{TOTAL}(f)$ includes both magnitude and phase response characteristics of the network 6.

When the composite reflection response $\Gamma_{TOTAL}$ of the network 6 is measured in the time domain, the measurement includes applying a stimulus signal, that is an impulse signal, to the network 6 and detecting the time domain reflection response $\Gamma_{TOTAL}(t)$ of the network 6 to the impulse signal. Typically, the impulse signal is a narrow pulse or step transition in the time domain that has a corresponding spectral content that is sufficiently broad to resolve faults, impedance mismatches and other discontinuities in the network 6. The time domain reflection response $\Gamma_{TOTAL}(t)$ includes both amplitude and polarity response characteristics of the network 6.

Figure 3:
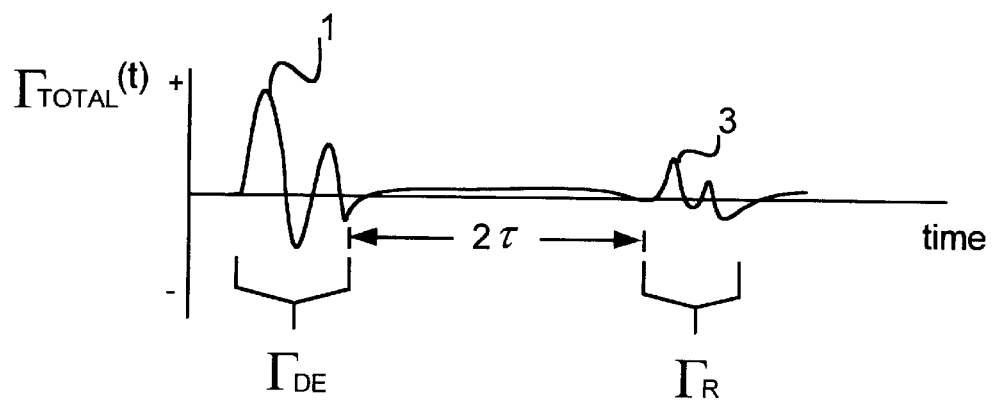
FIG. 3 shows an example of a composite reflection response of the network shown in FIG. 1.

In step 24 of the method 20, the reflection response $\Gamma_{DE}$ of the dispersive element 4 is isolated from a remainder $\Gamma_R$ of the composite reflection response $\Gamma_{TOTAL}$ of the network 6. Under condition that the composite reflection response $\Gamma_{TOTAL}$ is measured in the time domain, isolating the reflection response $\Gamma_{DE}$ of the dispersive element 4 includes gating the detected time domain response $\Gamma_{TOTAL}(t)$ of the network 6 to select the first discontinuity 1 representing the reflected response $\Gamma_{DE}$ of the dispersive element 4 and to reject the second discontinuity 3 representing the remainder $\Gamma_R$ of the composite reflection response $\Gamma_{TOTAL}$ of the network 6. FIG. 3 shows an example of the time domain reflection response $\Gamma_{TOTAL}(t)$ of the network 6, including the reflected response $\Gamma_{DE}$ of the dispersive element 4 and the remainder $\Gamma_R$ of the composite reflection response $\Gamma_{TOTAL}$ of the network 6. The first discontinuity 1 and the second discontinuity 3 are distinguished based on the propagation delay $\tau$ of the transmission line 8.

Under condition that the composite reflection response $\Gamma_{TOTAL}$ is measured in the frequency domain, isolating the reflection response $\Gamma_{DE}$ of the dispersive element 4 includes performing an inverse frequency transform on the detected frequency domain response $\Gamma_{TOTAL}(f)$ of the network 6 to derive the corresponding time domain response $\Gamma_{TOTAL}(t)$ of the network 6 (such as the time domain response $\Gamma_{TOTAL}(t)$ shown in FIG. 3). The inverse frequency transform is an inverse Fourier Transform, inverse Hilbert Transform, inverse Laplace Transform or inverse of any other suitable mapping between the frequency domain response $\Gamma_{TOTAL}(f)$ and the corresponding time domain response $\Gamma_{TOTAL}(t)$. Isolating the reflection response $\Gamma_{DE}$ of the dispersive element 4 then includes gating the corresponding time domain response $\Gamma_{TOTAL}(t)$ of the network 6 to select the first discontinuity 1 representing the reflected response $\Gamma_{DE}$ of the dispersive element 4 and to reject the second discontinuity 3 representing the remainder $\Gamma_R$ of the composite reflection response $\Gamma_{TOTAL}$ of the network 6. The first discontinuity 1 and the second discontinuity 3 are distinguished based on the propagation delay $\tau$ of the transmission line 8.

In step 26 of the method 20, the set of transmission parameters $T_{21}$, $T_{12}$ for the dispersive element 4 is generated from the isolated reflection response $\Gamma_{DE}$ of the dispersive element 4. Generating the set of transmission response parameters $T_{21}$, $T_{12}$ from the isolated reflection response $\Gamma_{DE}$ of the dispersive element 4 includes establishing a reflection parameter for the dispersive element 4 according to the gated time domain response of the dispersive element 4, where the reflection parameter is a reflection coefficient, or other reflection parameter capable of being derived from the isolated reflection response $\Gamma_{DE}$ of the dispersive element 4. In one example, the reflection parameter is the reflection scattering parameter, denoted as $S11_{DE}$. Scattering parameters have wide-spread use in the field of network analysis.

Generating the set of transmission parameters $T_{21}$, $T_{12}$ then includes approximating, or designating, the dispersive element 4 to be reciprocal, lossless and of minimum phase, and establishing the forward transmission parameter $T_{21}$ and the reverse transmission parameter $T_{12}$ of the dispersive element 4 based on these designations and the established reflection parameter. Designating the dispersive element 4 to be reciprocal means that the forward transmission characteristics and the reverse transmission characteristics of the dispersive element 4 are set equal. Passive elements or components are reciprocal. Designating the dispersive element 4 to be lossless means that signals applied to the dispersive element 4 are reflected by the dispersive element 4 or transmitted through the dispersive element 4, but are not absorbed by the dispersive element 4. Many types of elements or components having low loss can be approximated to be lossless. Designating the dispersive element 4 to be of minimum phase enables phase characteristics of the transmission parameters of the dispersive element 4 to be derived from the magnitude characteristics of transmission parameters of the dispersive element 4. Generally, elements or components that have a transfer function lacking poles in the right hand plane are of minimum phase. Designating the dispersive element 4 to have the attributes of reciprocity, losslessness and minimum phase is an approximation of the actual attributes of the dispersive element 4. The accuracy with which the reflection characteristics of the DUT 2 is measured by the method 20 and apparatus 30 generally decreases as the actual attributes of the dispersive element 4 deviate from the designated or approximated attributes of the dispersive element 4.

The established reflection parameter and transmission parameters are in either the frequency domain or the time domain. In one example, the forward and reverse transmission parameters $T_{21}$, $T_{12}$ are the forward and reverse transmission scattering parameters, denoted as $S21_{DE}$, $S12_{DE}$, respectively. These transmission scattering parameters $S21_{DE}$, $S12_{DE}$ are established from the designations and the established reflection scattering parameter $S11_{DE}$ according to the following relationships:

$$|S21_{DE}|=|S12_{DE}|=(1-|S11_{DE}|^2)^{1/2}$$

$$\text{Ang } S21_{DE} = \text{Ang } S12_{DE} = \text{Imag}(\text{Hilbert }(\text{LOG}_e(|S21_{DE}|)))$$

where the symbol | | means magnitude, Imag means imaginary part, Ang means angle or phase, $\text{LOG}_e$ means natural logarithm, and where Hilbert means Hilbert Transform. This example illustrates how the set of transmission parameters $T_{21}$, $T_{12}$ are generated when the reflection parameter and the transmission parameter are scattering parameters. However, other known types of transmission parameters $T_{21}$, $T_{12}$ used in network analysis, capable of being derived from the established reflection parameter and suitable for characterizing the dispersive element 4, are alternatively established.

In step 28 of the method 20, the generated set of transmission parameters is applied to the remainder $\Gamma_R$ of the composite reflection response $\Gamma_{TOTAL}$ of the network 6 to extract the reflection characteristic $\Gamma_{DUT}$ of the DUT 2. When the forward transmission parameter $T_{21}$ and the reverse transmission parameter $T_{12}$ are in the time domain, applying the generated set of transmission parameters $T_{21}$, $T_{12}$ includes convolving an inverse of each of the forward transmission parameter and the reverse transmission parameter with the remainder $\Gamma_R$ of the composite reflection response $\Gamma_{TOTAL}$ of the network 6 to extract the reflection. In the example where the established transmission parameters $T_{21}$, $T_{12}$ are in the time domain and are the forward and reverse transmission scattering parameters $S21_{DE}$, $S12_{DE}$, respectively, the measured reflection characteristic $\Gamma_{DUT}$ of the DUT 2 in the time domain, denoted as the reflection scattering parameter $S11_{DUT}(t)$, is extracted in step 28 according to the following relationship:

$$S11_{DUT}(t)=(S21_{DE}(t))^{-1} * \Gamma_R(t) * (S12_{DE}(t))^{-1}$$

where * denotes convolution, and $\Gamma_R(t)$ is the remainder $\Gamma_R$ of the composite reflection response $\Gamma_{TOTAL}$ of the network 6 in the time domain, and where $S21_{DE}(t)$ and $S12_{DE}(t)$ denote the forward and reverse transmission scattering parameters, respectively, in the time domain.

When the forward transmission parameter $T_{21}$ and the reverse transmission parameter $T_{12}$ are in the frequency domain, applying the generated set of transmission parameters $T_{21}$, $T_{12}$ includes multiplying an inverse of each of the forward transmission parameter and the reverse transmission parameter with the remainder $\Gamma_R$ of the composite reflection response $\Gamma_{TOTAL}$ of the network 6. In the example where the transmission parameters are in the frequency domain and are the forward and reverse transmission scattering parameters $S12_{DE}$, $S21_{DE}$, respectively, the measured reflection characteristic $\Gamma_{DUT}$ of the DUT 2 in the frequency domain; denoted as the reflection scattering parameter $S11_{DUT}(f)$, is extracted in step 28 according to the following relationship:

$$S11_{DUT}(f) = (S21_{DE}(f))^{-1} \times \Gamma_R(f) \times (S12_{DE}(f))^{-1}$$

where x denotes multiplication, and $\Gamma_R(f)$ is the remainder $\Gamma_R$ of the composite reflection response $\Gamma_{TOTAL}$ of the network 6 in the frequency domain, and where $S21_{DE}(f)$ and $S12_{DE}(f)$ denote the forward and reverse transmission scattering parameters, respectively, in the frequency domain.

Figure 4:
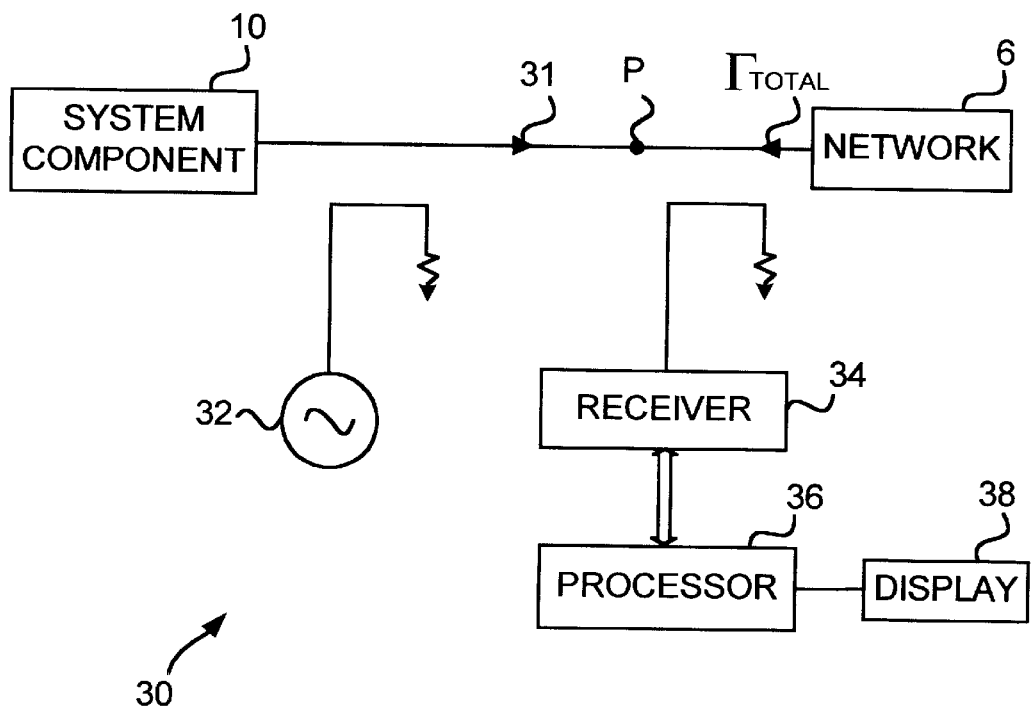
FIG. 4 shows a reflection measurement apparatus constructed according to a second embodiment of the present invention.

FIG. 4 shows the reflection measurement apparatus 30 constructed according to the second embodiment of the present invention. The source 32 is coupled to the network 6 at the access point P. The source 32 is a signal generator or synthesizer that provides the stimulus signal 31 to the network 6, where the stimulus signal 31 is as depicted in the description of step 22 of the method 20. The receiver 34 is also coupled to the network 6 at the access point P and measures the composite reflection response $\Gamma_{TOTAL}$ of the network 6 the stimulus signal 31. The access point P at which the receiver is coupled to the network 6 is either overlapping with the access point P at which the source 32 is coupled to the network 6 or it is displaced from the access point P at which the source 32 is coupled to the network 6. The receiver 34 interfaces with the processor 36 that isolates the reflection response $\Gamma_{DE}$ of the dispersive element 4 from the remainder $\Gamma_R$ of the composite reflection response $\Gamma_{TOTAL}$ of the network 6, generates the set of transmission parameters for the dispersive element 4 from the isolated reflection response $\Gamma_{DE}$ of the dispersive element 4, and applies the generated set of transmission parameters to the remainder $\Gamma_R$ of the composite reflection response $\Gamma_{TOTAL}$ of the network 6 to extract the reflection characteristic $\Gamma_{DUT}$ of the DUT 2, as detailed in the description of steps 24, 26, 28, respectively, of the method 20. The apparatus 30 optionally includes a display 38 coupled to the processor 36, depicting the measured reflection characteristic $\Gamma_{DUT}$ of the DUT 2. The source 32, receiver 34, processor 36 and optional display 38 are incorporated in a vector network analyzer, time domain reflectometer or other type of instrument or system. Alternatively, the apparatus 30 is implemented with the source 32 and receiver 34 coupled to a computer that performs the steps of the method 20.

While the embodiments of the present invention has been illustrated in detail, it should be apparent that modifications and adaptations to these embodiments may occur to one skilled in the art without departing from the scope of the present invention as set forth in the following claims.

What is claimed is:

1. A method for measuring a reflection characteristic of a device under test (DUT) coupled to a dispersive element, comprising:

measuring a composite reflection response of a network including the DUT and the dispersive element coupled to the DUT via a transmission line that has an associated propagation delay;

isolating a reflection response of the dispersive element from a remainder of the composite reflection response of the network;

generating a set of transmission parameters for the dispersive element from the isolated reflection response of the dispersive element; and applying the generated set of transmission parameters to the remainder of the composite reflection response of the network to extract the reflection characteristic of the DUT.

2. The method of claim 1 wherein measuring a composite reflection response includes applying a stimulus signal having a predefined frequency span to the network and detecting the composite reflection response of the network to the stimulus signal in a frequency domain.

3. The method of claim 1 wherein measuring a composite reflection response includes applying a predefined impulse signal to the network and detecting the composite reflection response of the network to the predefined impulse signal in a time domain.

4. The method of claim 3 wherein isolating the reflection response of the dispersive element includes gating the composite reflection response of the network to select a first discontinuity representing the reflection response of the dispersive element, and to reject a second discontinuity representing the remainder of the composite reflection response of the network, wherein the first discontinuity and the second discontinuity are distinguished according to the associated propagation delay of the transmission line.

5. The method of claim 2 wherein isolating the reflection response of the dispersive element includes performing an inverse frequency transform on the detected composite reflection response of the network to the stimulus signal to derive a corresponding composite reflection response of the network in the time domain, gating the corresponding composite reflection response of the network in the time domain to select a first discontinuity representing the reflection response of the dispersive element, and to reject a second discontinuity representing the remainder of the composite reflection response of the network, wherein the first discontinuity and the second discontinuity are distinguished according to the associated propagation delay of the transmission line.

6. The method of claim 4 wherein generating a set of transmission parameters for the dispersive element from the isolated reflection response of the dispersive element includes establishing a reflection parameter for the dispersive element according to the reflection response of the dispersive element, designating the dispersive element to be reciprocal, lossless and of minimum phase, and establishing a forward transmission parameter and a reverse transmission parameter for the dispersive element based on the designations and the established reflection parameter, the forward transmission parameter and the reverse transmission parameter being in one of the frequency domain and the time domain.

7. The method of claim 5 wherein generating a set of transmission parameters for the dispersive element from the isolated reflection response of the dispersive element includes establishing a reflection parameter for the dispersive element according to the reflection response of the dispersive element, designating the dispersive element to be reciprocal, lossless and of minimum phase, and establishing a forward transmission parameter and a reverse transmission parameter for the dispersive element based on the designations and the established reflection parameter, the forward transmission parameter and the reverse transmission parameter being in one of the frequency domain and the time domain.

8. The method of claim 6 wherein the established reflection parameter for the dispersive element is a reflection scattering parameter of the dispersive element, the established forward transmission parameter is a forward transmission scattering parameter of the dispersive element and the established reverse transmission parameter is a reverse transmission scattering parameter of the dispersive element.

9. The method of claim 7 wherein the established reflection parameter for the dispersive element is a reflection scattering parameter of the dispersive element, the established forward transmission parameter is a forward transmission scattering parameter of the dispersive element and the established reverse transmission parameter is a reverse transmission scattering parameter of the dispersive element.

10. The method of claim 6 wherein applying the generated set of transmission parameters to the remainder of the composite reflection response of the network includes convolving an inverse of each of the forward transmission parameter and the reverse transmission parameter with the remainder of the composite reflection response of the network when the forward transmission parameter and the reverse transmission parameter are in the time domain, and includes multiplying an inverse of each of the forward transmission parameter and the reverse transmission parameter with the remainder of the composite reflection response of the network when the forward transmission parameter and the reverse transmission parameter are in the frequency domain.

11. The method of claim 7 wherein applying the generated set of transmission parameters to the remainder of the composite reflection response of the network includes convolving an inverse of each of the forward transmission parameter and the reverse transmission parameter with the remainder of the composite reflection response of the network when the forward transmission parameter and the reverse transmission parameter are in the time domain, and includes multiplying an inverse of each of the forward transmission parameter and the reverse transmission parameter with the remainder of the composite reflection response of the network when the forward transmission parameter and the reverse transmission parameter are in the frequency domain.

12. The method of claim 8 wherein applying the generated set of transmission parameters includes convolving an inverse of each of the forward transmission parameter and the reverse transmission parameter with the remainder of the composite reflection response of the network when the forward transmission parameter and the reverse transmission parameter are in the time domain, and includes multiplying an inverse of each of the forward transmission parameter and the reverse transmission parameter with the remainder of the composite reflection response of the network when the forward transmission parameter and the reverse transmission parameter are in the frequency domain.

13. The method of claim 9 wherein applying the generated set of transmission parameters includes convolving an inverse of each of the forward transmission parameter and the reverse transmission parameter with the remainder of the composite reflection response of the network when the forward transmission parameter and the reverse transmission parameter are in the time domain, and includes multiplying an inverse of each of the forward transmission parameter and the reverse transmission parameter with the remainder of the composite reflection response of the network when the forward transmission parameter and the reverse transmission parameter are in the frequency domain.

14. An apparatus for measuring a reflection characteristic of a device under test (DUT) coupled to a dispersive element, comprising:
a source coupled to a network including the DUT and the dispersive element coupled to the DUT via a transmission line that has an associated propagation delay, the source providing a stimulus signal to the network;
a receiver coupled to the network measuring a composite reflection response of the network to the stimulus signal;
a processor coupled to the receiver, isolating a reflection response of the dispersive element from a remainder of the composite reflection response of the network, generating a set of transmission parameters for the dispersive element from the isolated reflection response of the dispersive element, and applying the generated set of transmission parameters to the remainder of the composite reflection response of the network to extract the reflection characteristic of the DUT.

15. The apparatus of claim 14 wherein the stimulus signal has a predefined frequency span and the composite reflection response of the network is in a frequency domain.

16. The apparatus of claim 14 wherein the stimulus signal is a predefined impulse signal and the composite reflection response of the network is in a time domain.

17. The apparatus of claim 15 wherein the processor isolates the reflection response of the dispersive element by performing an inverse frequency transform on the detected composite reflection response of the network to the stimulus signal in the frequency domain to derive a corresponding composite reflection response of the network in the time domain, and by gating the corresponding composite reflection response of the network in the time domain to select a first discontinuity representing the reflection response of the dispersive element, and to reject a second discontinuity representing the remainder of the composite reflection response of the network, wherein the first discontinuity and the second discontinuity are distinguished according to the associated propagation delay of the transmission line.

18. The apparatus of claim 16 wherein the processor isolates a reflection response of the dispersive element by gating the composite reflection response of the network in the time domain to select a first discontinuity representing the reflection response of the dispersive element and to reject a second discontinuity representing the remainder of the composite reflection response of the network, wherein the first discontinuity and the second discontinuity are distinguished according to the associated propagation delay of the transmission line.

19. The apparatus of claim 17 wherein the processor generates a set of transmission response parameters for the dispersive element from the isolated reflection response of the dispersive element by establishing a reflection parameter for the dispersive element according to the composite reflection response of the dispersive element, designating the dispersive element to be reciprocal, lossless and of minimum phase, and establishing a forward transmission parameter and a reverse transmission parameter for the dispersive element based on the designations and the established reflection parameter, the forward transmission parameter and the reverse transmission parameter being in one of the frequency domain and the time domain.

20. The apparatus of claim 18 wherein the processor generates a set of transmission response parameters for the dispersive element from the isolated reflection response of the dispersive element by establishing a reflection parameter for the dispersive element according to the composite reflection response of the dispersive element, designating the dispersive element to be reciprocal, lossless and of minimum phase, and establishing a forward transmission parameter and a reverse transmission parameter for the dispersive element based on the designations and the established reflection parameter, the forward transmission parameter and the reverse transmission parameter being in one of the frequency domain and the time domain.

21. The apparatus of claim 19 wherein the established reflection parameter for the dispersive element is a reflection scattering parameter of the dispersive element, the established forward transmission parameter is a forward transmission scattering parameter of the dispersive element and the established reverse transmission parameter is a reverse transmission scattering parameter of the dispersive element.

22. The apparatus of claim 20 wherein the established reflection parameter for the dispersive element is a reflection scattering parameter of the dispersive element, the established forward transmission parameter is a forward transmission scattering parameter of the dispersive element and the established reverse transmission parameter is a reverse transmission scattering parameter of the dispersive element.

23. The apparatus of claim 19 wherein the processor applies the generated set of transmission parameters to the remainder of the composite reflection response of the network by convolving an inverse of each of the forward transmission parameter and the reverse transmission parameter with the remainder of the composite reflection response of the network when the forward transmission parameter and the reverse transmission parameter are in the time domain, and by multiplying an inverse of each of the forward transmission parameter and the reverse transmission parameter with the remainder of the composite reflection response of the network when the forward transmission parameter and the reverse transmission parameter are in the frequency domain.

24. The apparatus of claim 20 wherein the processor applies the generated set of transmission parameters to the remainder of the composite reflection response of the network by convolving an inverse of each of the forward transmission parameter and the reverse transmission parameter with the remainder of the composite reflection response of the network when the forward transmission parameter and the reverse transmission parameter are in the time domain, and by multiplying an inverse of each of the forward transmission parameter and the reverse transmission parameter with the remainder of the composite reflection response of the network when the forward transmission parameter and the reverse transmission parameter are in the frequency domain.

* * * * *